(12) United States Patent
Huber

(10) Patent No.: US 6,434,061 B1
(45) Date of Patent: Aug. 13, 2002

(54) CIRCUIT CONFIGURATION FOR ENHANCING PERFORMANCE CHARACTERISTICS OF FABRICATED DEVICES

(75) Inventor: Brian W. Huber, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/654,098

(22) Filed: Aug. 31, 2000

(51) Int. Cl.[7] .................................................. G11C 7/00
(52) U.S. Cl. ........................ 365/194; 365/191; 327/261; 327/263; 327/264; 327/285
(58) Field of Search .......................... 365/194, 189.05, 365/230.06, 230.08, 191; 327/263, 261, 264, 285

(56) References Cited

U.S. PATENT DOCUMENTS

| | | | | |
|---|---|---|---|---|
| 6,002,285 A | * | 12/1999 | Muhich et al. | ............. 327/208 |
| 6,049,504 A | * | 4/2000 | Suh | ............................. 365/233 |
| 6,128,173 A | * | 10/2000 | Iwasaki | ....................... 361/111 |
| 6,150,862 A | * | 11/2000 | Vikinski | ...................... 327/262 |
| 6,154,078 A | * | 11/2000 | Stave | .......................... 327/263 |

* cited by examiner

Primary Examiner—Hoai V. Ho
(74) Attorney, Agent, or Firm—Thorp Reed & Armstrong, LLP (57) ABSTRACT

A compensation circuit includes at least one of an n-channel device connected to oppose a high-to-low transition and a p-channel device connected to oppose a low-to high transition. The n-channel and p-channel devices may be diodes, transistors, or transistors connected to function as diodes. The n-channel and p-channel devices may be connected to a large variety of devices and circuits, such as phase locked loops, delay locked loops, clock circuits, or any circuit which requires two balanced paths, one through n-channel devices and one through p-channel devices, to compensate for process variations. Methods for balancing a circuit path and compensating for process variations are also disclosed.

12 Claims, 7 Drawing Sheets

CIRCUIT CONFIGURATION FOR ENHANCING PERFORMANCE CHARACTERISTICS OF FABRICATED DEVICES

CROSS REFERENCE TO RELATED APPLICATIONS

The present application is related to pending U.S. patent application Ser. No. 09/649,970, entitled "Method and Apparatus for Phase-Splitting a Clock Signal" and assigned to the same assignee as the assignee of the present invention.

BACKGROUND OF THE INVENTION

1. Field of the Invention

The present invention is directed to logic configurations and, more particularly, to logic configurations that may be used to enhance the performance characteristics of fabricated devices.

2. Description of the Background

It is known in the art that circuits having ideal characteristics are rarely achieved because of process variations in the fabrication process. For example, in a CMOS process, one "pass" of the process may result in fast NMOS transistors and slow PMOS transistors while another "pass" of the process may result in just the opposite. Having NMOS and CMOS transistors that are matched, however, is a very important aspect of circuit design because many logic circuits are designed to operate in a balanced mode, i.e. signals must propagate through paths constructed of n-channel devices and paths of p-channel devices at the same speeds relative to each other.

For example, clock signals are commonly used in digital circuits, including circuits used in memory devices, to control the timing at which various event occur. In some cases, a single clock signal is used. However, in other cases, it is necessary to use both the clock signal and the complement of the clock signal. Such signals are typically generated by applying a clock signal to a phase splitter, which then generates a clock signal and its complement for use by the digital circuit.

It is important that the clock signal and its complement be symmetrical, i.e., the edges of both signals be substantially aligned and have the same slew rate. The clock signal and its complement generated by an ideal phase splitter would have a 50 percent duty cycle, equal rise and fall times, and they would be exactly 180degrees out of phase from each other. In practice, that ideal is rarely achieved. As a result, the inverters comprising the phase splitter respond differently to an incoming clock signal, and the respective clock signals generated by the inverters are not symmetrical.

Figure 1:
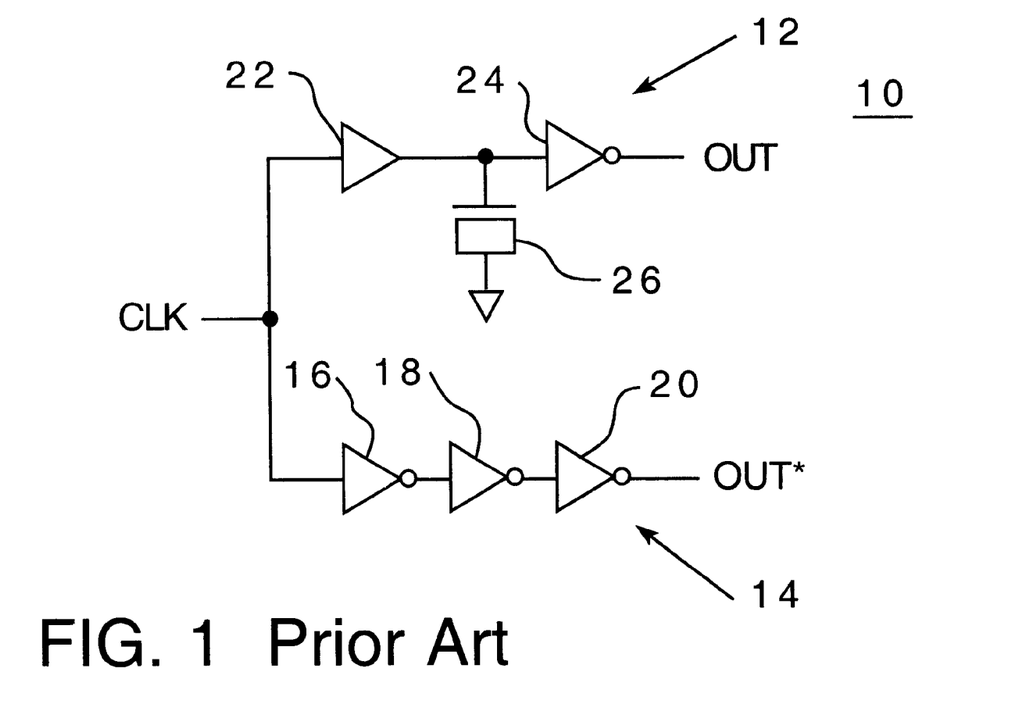
FIG. 1 illustrates a prior art phase splitter.

A conventional phase splitter 10 is illustrated in FIG. 1. The phase splitter 10 includes two branches 12, 14, one of which generates a signal OUT and the other of which generates its complement OUT*. The second branch 14 consists of three inverters 16, 18, 20. Because there is an odd number of inverters in the second branch 14, the output signal OUT* is the complement of the input signal CLK, but delayed in time by the sum of the propagation delays through each of the inverters 16, 18, 20.

The first branch 12 consists of two inverters 22, 24 and a capacitor 26 connected to the output of the first inverter 22. The size of the capacitor 26 is selected to delay the coupling of signals from the output of the first inverter 22 to the input of the second inverter 24 by an amount corresponding to the difference between the delay of the three inverters 16, 18, 20 and the two inverters 22, 24. As a result, the OUT signal and the OUT* signal are theoretically 180 degrees out of phase with each other. In practice, however, the OUT and OUT* may not be entirely symmetrical for several reasons. For example, although the capacitor 26 compensates for the delay of the extra inverter in the second branch 14 it also reduces the slew rate of the signal applied to the input of the inverter 24. As a result, the slew rate of the signal applied to the inverter 24 is substantially slower than the slew rate of the signal applied to the inverter 20. That difference in slew rates causes the rise and fall times of the signals OUT and OUT* to differ substantially from each other.

Proposals have been made to modify the phase splitter 10 shown in FIG. 1 by eliminating the capacitor 26 and instead adjusting the delay of each of the inverters 16, 18, 20, 22, 24 to achieve substantially the same result. More specifically, the inverters 16, 18, 20 may be designed so that the sum of the delays through the inverters 16, 20 is equal to the delay through the inverter 22. The inverters 18 and 24 are then designed so that they have equal propagation delays. As a result, the signals OUT and OUT* are, in theory, symmetrical. Again, in practice, the signals are anything but symmetrical for several reasons. For example, the inverters 16, 20 must be relatively fast so that the sum of their delays is equal to the delay of the inverter 22. The high speed of the inverter 20 causes it to have a relatively high slew rate. For the slew rate of the OUT signal to match the slew rate of the OUT* signal, the transistors used in the inverter 24 must be relatively large. However, the inverter 22 must be fairly slow to achieve the required delay, and, as a result, its output signal has a relatively low slew rate. The low slew rate of the inverter 22 makes it all the more difficult for the output of the inverter 24 to match the output of the inverter 20 so that OUT and OUT* will have the same rise and fall times.

Another example is a phase locked loop. A phase locked loop (PLL) is a circuit designed to minimize the phase difference between two signals. When the phase difference approaches zero, or is within a specified tolerance, the phase of the two signals is said to be "locked". A delay locked loop (DLL) is similar to a phase locked loop, but instead of producing an output signal which has the same phase as an input or reference signal, the delay locked loop produces an output signal that has some predefined phase delay with respect to a reference or input signal.

PLL's and DLL's are used in a variety of devices where the PLL or DLL must be constructed of all digital components. For example, all digital implementations of PLL's and DLL's are needed for such complex circuits as high speed memory devices. The local clock of certain types of memory devices needs to be in sync with, for example, a data bus so that data may be reliably written to or read from the bus. PLL's and DLL's are also needed when transferring data within the memory device to insure, for example, that data read out of the memory is properly presented to output pads. The paths used to construct PLL's and DLL's typically have a plurality of series connected inverters. As previously discussed, it may be difficult to achieve a balanced relative delay for both n-channel and p-channel transistor paths over process and condition variations. Thus, a need exits for a hardware solution that can be implemented in any number of logic circuits to compensate for fabrication process variations

SUMMARY OF THE PRESENT INVENTION

The present invention is directed to a compensation circuit which includes at least one of an n-channel device connected to oppose a high-to-low transition and a p-channel device connected to oppose a low-to high transition. The n-channel and p-channel devices may be diodes, transistors, or transistors connected to function as diodes. The n-channel and p-channel devices may be connected to a large variety of devices and circuits, such as phase locked loops, delay locked loops, clock circuits, or any circuit which requires two balanced paths, one through n-channel devices and one through p-channel devices, to compensate for process variations.

The present invention is also directed to a method for balancing a circuit path, comprising providing biasing an output terminal at a predetermined value to provide a resistance to transitions from a high to a low state and from a low to a high state. The voltage for the biasing step may be provided by a device in the circuit path or by a voltage source.

The method and apparatus of the present invention provide compensation for process variations between n-channel devices and p-channel devices in a simple and effective manner implemented by adding a minimal number of components to existing circuits. Those advantages and benefits, and others, will be apparent from the Description of the Preferred Embodiment hereinbelow.

BRIEF DESCRIPTION OF THE DRAWINGS

For the present invention to be easily understood and readily practiced, the present invention will now be described, for purposes of illustration and not limitation, in conjunction with the following figures, wherein.

DESCRIPTION OF THE PREFERRED EMBODIMENTS

Figure 2:
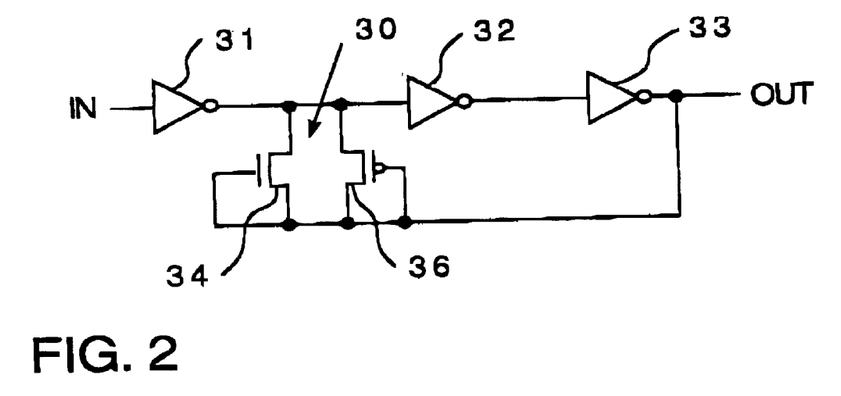
FIG. 2 illustrates one embodiment of a compensation circuit of the present invention used in conjunction with a plurality of inverters.

In FIG. 2, a compensation circuit 30, constructed according to the present invention, is illustrated in conjunction with a plurality of series connected inverters 31, 32, 33. The reader will recognize that the three series connected inverters 31, 32, 33 may be used in any number of logic circuits found in memory devices, such as phase splitters, delay lines, PLL's, DLL's, etc. The signal OUT available at an output terminal of inverter 33 is feed back to an input terminal of inverter 32 through an n-channel transistor 34 and a p-channel transistor 36. Each of the transistors 34, 36 is connected to function as a diode and are further connected in parallel with one another.

In operation, assume that an input signal IN is low. As a result, the outputs of the inverters 31 and 33 will be high and the output of the inverter 32 will be low. When the IN signal transitions high, the output of the inverter 31 attempts to transition low. However, this high-to-low transition is resisted by the high at the output of the inverter 33, which is coupled through the n-channel transistor 34 to the output of inverter 31. As a result, there is a delay before the transition voltage of the inverter 32 is reached. The magnitude of the delay can be adjusted by adjusting the ON impedance of the n-channel transistor 34 in relation to the impedance of an n-channel transistor (not shown) in the inverter 31. Eventually, the output of the inverter 32 transitions high, and the output of the inverter 33 transitions low. When the output of the inverter 33 transitions low, the power drain through the transistor 34 is eliminated.

When the IN signal transitions low, the output of the inverter 31 attempts to transition high, but is held low as a result of the low output of inverter 33 coupled through the p-channel transistor 36. Again, the magnitude of the resulting delay can be adjusted by adjusting the ON impedance of the p-channel transistors 36 in relation to the impedance of a p-channel transistor (not shown) in the inverter 31. Subsequently, when the output of the inverter 33 transitions high, the power drain through the transistor 36 is eliminated.

The characteristics of the compensation circuit 30 are preferably set at design time based on simulations so that the transistor pair 34, 36 compensates for process variations in the inverters 31, 32, 33. Alternatively, the transistor 34 could be replaced with two or more n-channel transistors while the transistor 36 could be replaced with two or more p-channel transistors, each of which can be optioned in (or out) with fusible links or the like to provide post-fabrication tuning. If the circuit path of FIG. 2 is used in parallel with another circuit path, symmetry of the path can be maintained with the compensation circuit 30. Furthermore, the compensation circuit 30 may be used in conjunction with other types of devices where the device produces an output signal that changes states between a high state and a low state through the use of complementary devices, e.g. p-channel and n-channel devices. Other devices may include basic logic gates such as AND gates, OR gates, NAND gates, NOR gates and logic circuits constructed of such gates.

Figure 3:
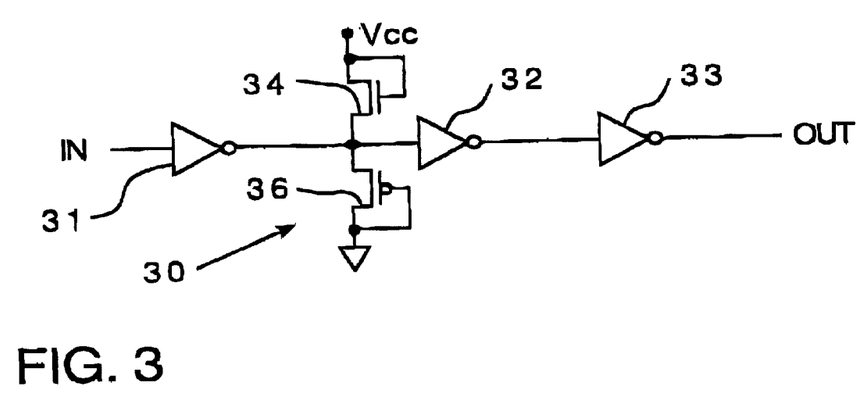
FIG. 3 illustrates another embodiment of a compensation circuit of the present invention used where power consumption is not an issue.

If power drain is not a factor, an embodiment of the type illustrated in FIG. 3 may be used. The embodiment of FIG. 3 uses the same components as the embodiment of FIG. 2, and its components have therefore been provided with the same reference numerals. In the embodiment of FIG. 3 the drain of the n-channel transistor 34 is coupled directly to a supply voltage $V_{cc}$ instead of to the output of the inverter 33. As a result, the transistor 34 continuously biases the output of the inverter 31 high to delay the high-to-low transitions at the output of the inverter 31. The embodiment of FIG. 3 also differs from the embodiment of FIG. 2 by coupling the drain of the p-channel transistor 36 to ground instead of to the output of the inverter 33. Again, the transistor 36 continuously biases the output of the inverter 31 low to delay the low-to-high transitions at the output of the inverter 31, thereby compensating for the p-channel transistors (not shown) in inverter 31.

Figure 4:
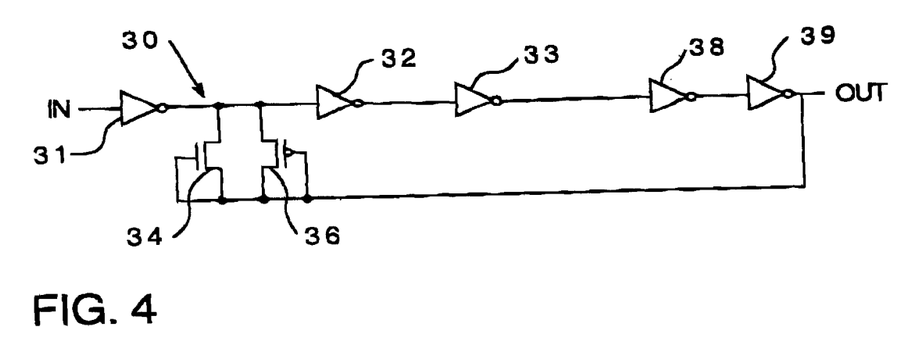
FIG. 4 illustrates another embodiment of a compensation circuit of the present invention used in conjunction with a plurality of inverters.

Another alternative embodiment is illustrated in FIG. 4. The alternative embodiment of FIG. 4 includes many of the components that are used in the embodiment of FIG. 2. Therefore, in the interest of brevity, an explanation of those components will not be repeated. The embodiment of FIG. 4 includes two additional inverters 38, 39 in series with inverters 30, 32, 33. The transistor pair 34, 36 is now coupled to the output of the inverter 39, which generates the OUT signal. Otherwise, the operation of the circuit path shown in FIG. 4 is the same as previously discussed.

Figure 5:
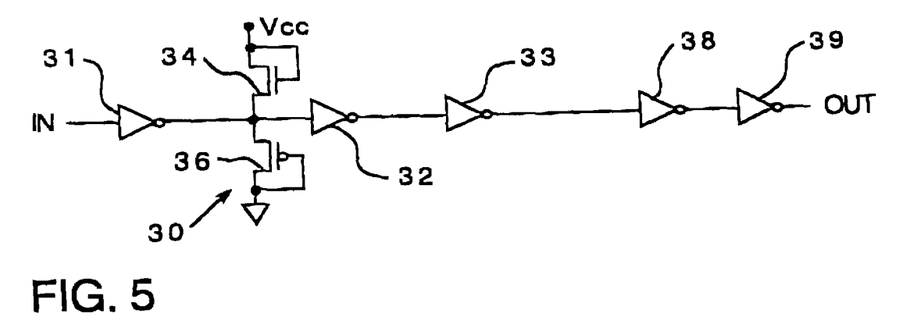
FIG. 5 illustrates another embodiment of a compensation circuit of the present invention used where power consumption is not an issue.

As with the embodiment of FIG. 3, the embodiment of FIG. 5 may be used if power drain is not a factor. The embodiment of FIG. 5 differs from the embodiment of FIG. 4 in the same manner that the embodiment of FIG. 3 differs from the embodiment of FIG. 2. Specifically, the drain of the n-channel transistor 34 is coupled directly to a supply voltage $V_{cc}$ instead of to the output of the inverter 39, and the drain of the p-channel transistor 36 is coupled directly to ground instead of to the output of the inverter 39. As explained above with reference to FIG. 3, the n-channel transistor 34 and the p-channel transistor 36 each continuously compensate for the transistors in inverter 31.

Figure 6:
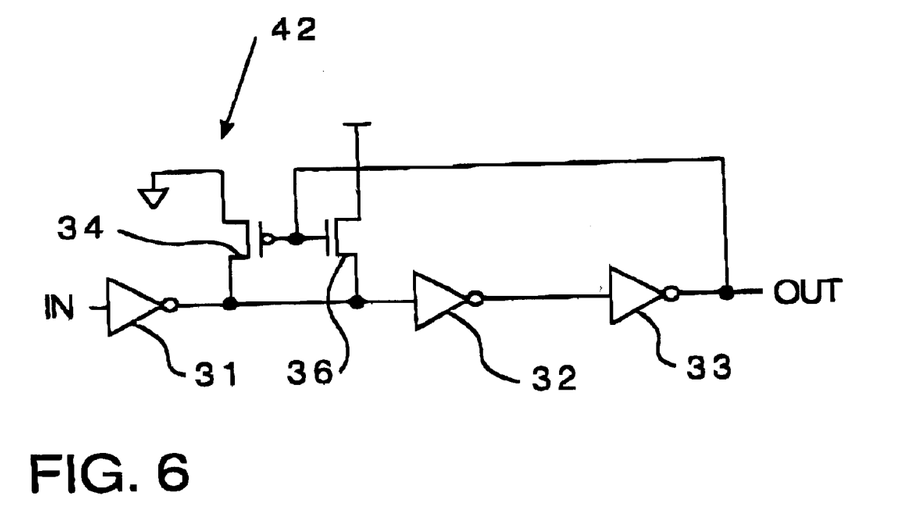
FIG. 6 illustrates another embodiment of a compensation circuit of the present invention used in conjunction with a plurality of inverters.

Yet another embodiment of a compensation circuit 42 is illustrated in FIG. 6. That embodiment also uses the same components as the embodiment of FIG. 2, and the components of the embodiment of FIG. 6 have therefore been provided with the same reference numerals. In FIG. 6, the drain of the n-channel transistor 36 is coupled to the supply voltage $V_{cc}$, and the drain of the p-channel transistors 34 is coupled to ground. Those changes alter the operation in two respects. First, the transistors 34, 36 no longer operate as diodes. Second, the current is supplied to the output of the inverter 31 from either $V_{cc}$ or ground rather than by the inverter 33. As a result of the reduced current demand, the inverter 33 may be made smaller.

In operation, the n-channel transistor 36 initially biases the output of the inverter 31 high to delay the high-to-low transitions at the output of the inverter 31. When the output of the inverter 31 has transitioned low, the n-channel transistor 36 is turned OFF to conserve power. The p-channel transistor 34 initially biases the output of the inverters 31 low to delay the low-to-high transitions at the output of the inverters 31. When the output of the inverter 31 has transitioned high, the p-channel transistor 36 is turned OFF to conserve power.

Figure 7:
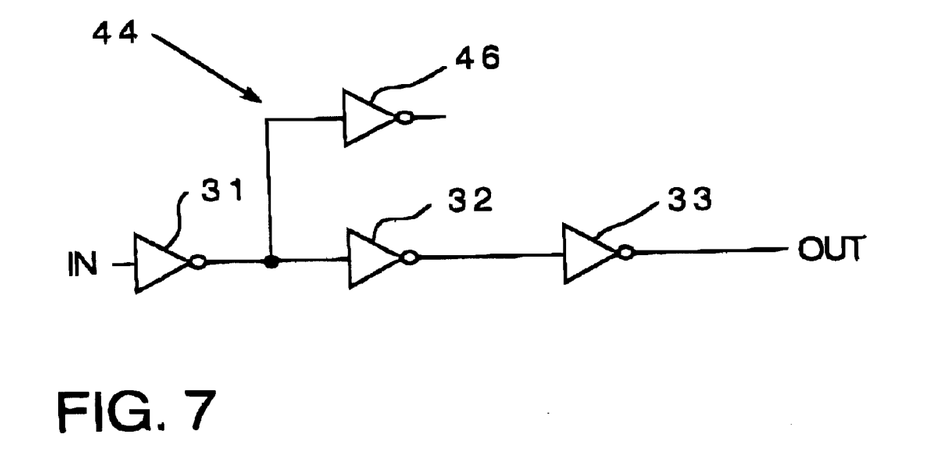
FIG. 7 illustrates the addition of a load to the compensation circuit.
Figure 8A:
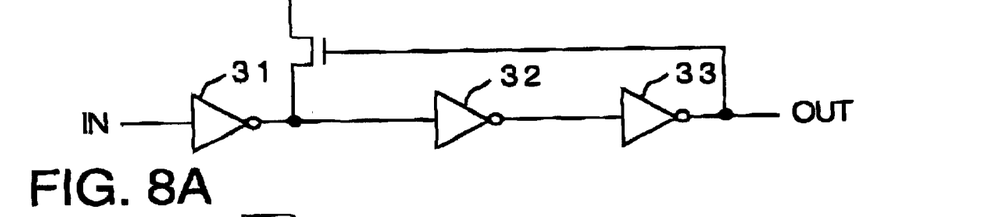
FIGS. 8A–8F illustrate one transistor embodiments of the present invention.
Figure 8B:
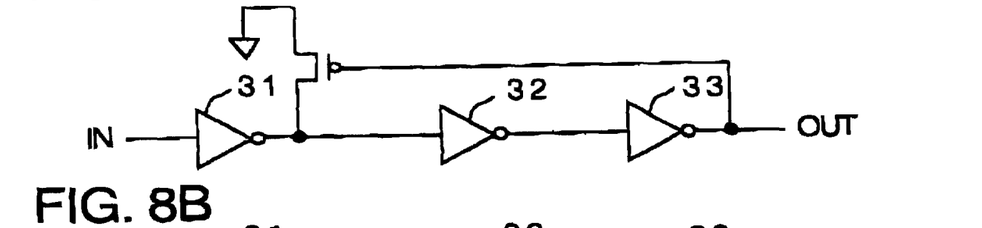
Figure 8C:
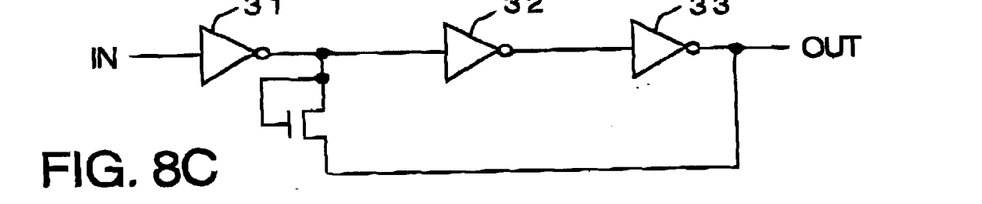
Figure 8D:
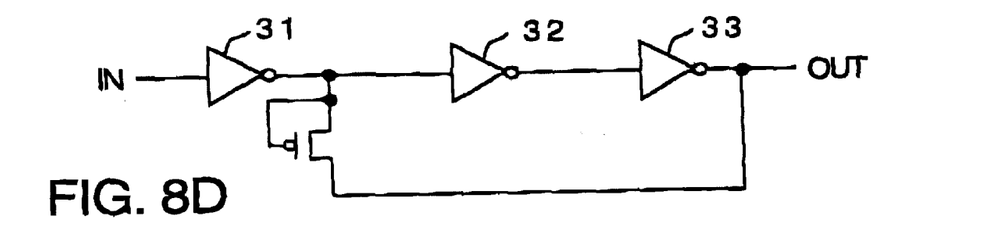
Figure 8E:
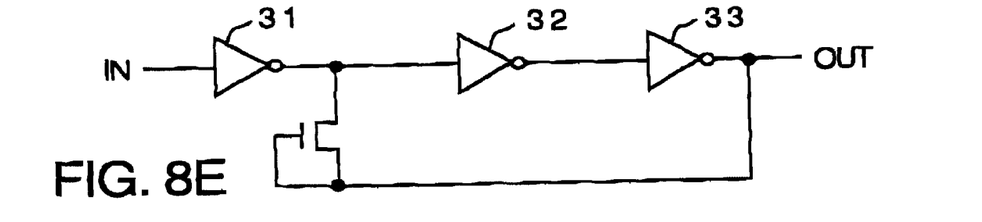
Figure 8F:
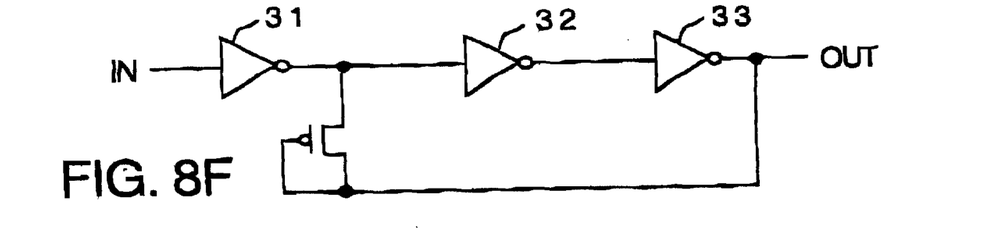

An addition to the compensation circuit 44 constructed according to the present invention is illustrated in FIG. 7. An inverter 46 is coupled to the output of the inverter 31 to increase the load that is driven by the inverter 31. Because the inverter 46 is used only for loading the input inverter 31, the output of the inverter 46 may be left unconnected to any other circuitry or may drive other circuitry if desired. Inverter 46 may be added to the output of inverter 31 in any of embodiments of FIGS. 2–6. That is done to avoid extensive remodeling of similarly matched circuits but which have differing loads (i.e. smaller loads). Alternatively, the inverter 46 can be replaced by a capacitor to ground or any supply voltage.

It has been determined, under certain conditions, that compensation of only the n-channel or p-channel path needs to be provided. Accordingly, FIGS. 8A–8F illustrate various embodiments in which a single transistor is connected to oppose either a high-to-low transition or a low-to-high transition. Although it may seem counter-intuitive to use differing transistor channel types to counter one another, the reason the compensation works is that the compensation is actually directed to the entire circuit path, i.e. inverters 31, 32, 33, which indirectly compensates for individual transistors.

Figure 9:
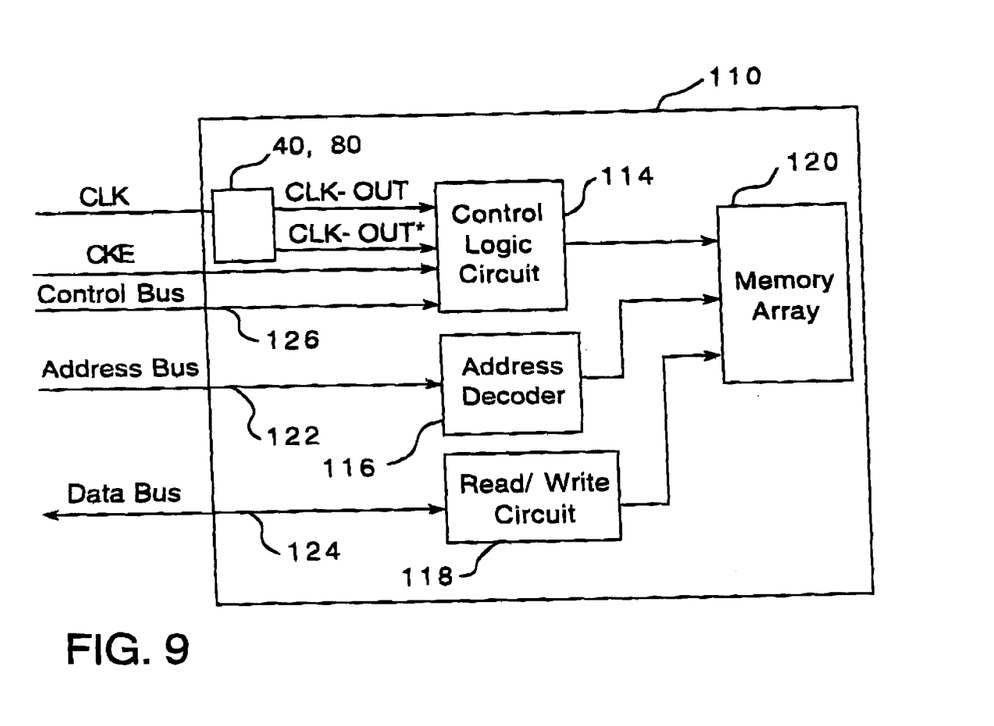
FIG. 9 illustrates a memory device in which the present invention may be used.

The compensation circuits 30, 42, 44 may be used in a variety of devices, including, as shown in FIG. 8, a synchronous dynamic random access memory 110 ("SDRAM"). The SDRAM 110 includes a control logic circuit 114, an address decoder 116, and a read/write circuit 118, all of which are coupled to a memory array 120. As is well known in the art, the address decoder 116 receives an address over an address bus 122 and provides a decoded address to the memory array 120 to select an individual memory cell in the memory array. The read/write circuit 118 operates to received data over a data bus 240 and provide that data to the memory array 120 during a write operation, and to provide data from the memory array to the data bus during a read operation.

The SDRAM 110 performs data transfer operations under control of the control logic circuit 114 which receives data transfer commands, including read or write commands, over a control bus 126. In response to these data transfer commands, the control logic circuit 114 executes each of the steps required to perform a read or write data transfer operation. The SDRAM 110 also receives a clock signal CLK to control the timing of various operations. The clock signal CLK is converted to complementary clock signals CLK-OUT and CLK-OUT* by using a phase splitter incorporating one of the embodiments of a compensation circuit according to the invention. The CLK-OUT and CLK-OUT* signals are applied to the control logic circuit 114 to cause the control logic circuit 114 to synchronously execute one or more memory operations twice for each cycle of the CLK signal. These operations are performed at intervals that are spaced substantially equally from each other because of the symmetry of the CLK-OUT and CLK-OUT* signals. A clock enable signal CKE enables the clocking of the control logic circuit 114 by the CLK-OUT and CLK-OUT* signals.

Figure 10:
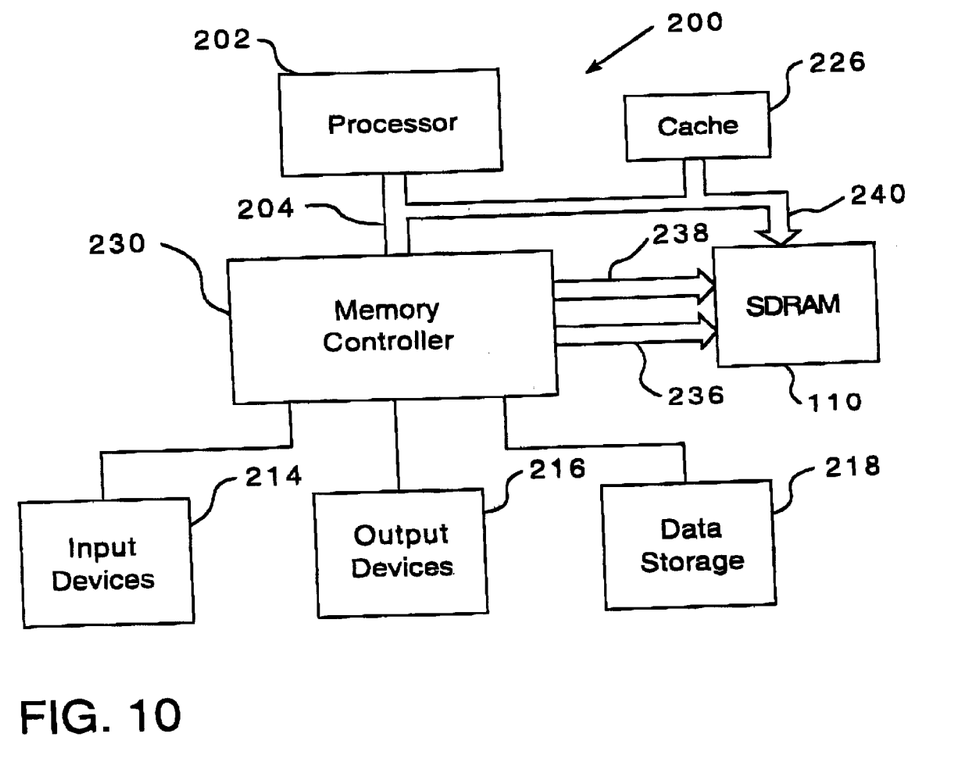
FIG. 10 illustrates a computer system in which the memory device of FIG. 9 may be used.

FIG. 9 illustrates a computer system 200 containing the SDRAM 110 of FIG. 8 using one of the compensation circuits according to the invention. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM") and to the SDRAM 110 through a memory controller 230. The memory controller 230 normally includes a control bus 236 and an address bus 238 that are coupled to the SDRAM 110. A data bus 240 may be coupled to the processor bus 204 either directly (as shown), through the memory controller 230, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A compensation circuit connected to the output of a device of the type that transitions between first and second states, comprising:
   a first transistor connected between a voltage source and an output terminal of the device to oppose a transition from one state to a second state; and
   a second transistor connected between the output of the device and ground to oppose a transition from said second state to said first state.

2. The compensation circuit of claim 1 wherein said first and second transistors are connected to function as a diode.

3. The compensation circuit of claim 1 wherein said first transistor is an n-channel transistor and wherein said second transistor is a p-channel transistor.

4. A combination, comprising:
   at least three devices connected in series, said devices of a type that produce an output signal that transitions between first and second states and between said second and first states;
   a first transistor connected between a voltage source and the output of one of said three devices to oppose one of said transitions; and
   a second transistor connected between the output of the device and ground to oppose the other of said transistors.

5. The combination of claim 4 wherein said first and second transistors are connected to function as a diode.

6. The combination of claim 4 wherein said first transistor is an n-channel transistor and wherein said second transistor is a p-channel transistor.

7. A memory device, comprising:
   an array of memory cells;
   an address decoder for receiving an address and for identifying at least a specific cell in said array of memory cells corresponding to said address;
   a read/write circuit for reading information out of and writing information into said specific cell;
   a control logic circuit for receiving command signals and generating control signals in response thereto for controlling said address decoder and said read/write circuit; and
   a clock circuit for producing clocking signals for input to said control logic, said clock circuit including a path for delaying the clock signal comprising:
      at least three inverters connected in series;
      a first transistor connected between a voltage source and an output terminal of the device to oppose a transition from one state to a second state; and
      a second transistor connected between the output of the device and ground to oppose a transition from said second state to said first state.

8. A computer system, comprising:
   a processor having a processor bus;
   an input device coupled to the processor through the processor bus;
   an output device coupled to the processor through the processor bus; and
   a memory device coupled to the processor bus, the memory device comprising:
      an array of memory cells;
      an address decoder for receiving an address and for identifying at least a specific cell in said array of memory cells corresponding to said address;
      a read/write circuit for reading information out of and writing information into said specific cell;
      a control logic circuit for receiving command signals and generating control signals in response thereto for controlling said address decoder and said read/write circuit; and
      a clock circuit for producing clocking signals for input to said control logic, said clock circuit including a path for delaying the clock signal comprising:
         at least three inverters connected in series;
         a first transistor connected between a voltage source and an output terminal of the device to oppose a transition from one state to a second state; and
         a second transistor connected between the output of the device and ground to oppose a transition from said second state to said first state.

9. A combination, comprising:
   at least three devices connected in series, said devices of a type that produce an output signal that transitions between different states;
   an n-channel transistor connected to provide resistance to a high-to-low transition; and
   a p-channel transistor connected to provide resistance to a low-to-high transition; and
   wherein a gate and a drain terminal of said n-channel transistor are connected to a voltage source and a source terminal is connected to an output terminal of one of said devices, and wherein a gate and a drain terminal of said p-channel device are connected to ground and a source terminal is connected to an output terminal of one of said devices such that such n-channel transistor and said p-channel transistor operate as diodes.

10. The combination of claim 9, wherein said source terminals are connected to the output terminal of the same device.

11. A memory device, comprising:
   an array of memory cells;
   an address decoder for receiving an address and for identifying at least a specific cell in said array of memory cells corresponding to said address;
   a read/write circuit for reading information out of and writing information into said specified cell;
   a control logic circuit for receiving command signals and generating control signals in response thereto for controlling said address decoder and said read/write circuit; and
   a clock circuit for producing clock signals for input to said control logic, said clock circuit including a path for delaying the clock signal comprising:
      at least three devices connected in series, said devices of a type that produce an output signal that transitions between different states; and
      an n-channel transistor connected to provide resistance to a high-to-low transition; and
      a p-channel transistor connected to provide resistance to a low-to-high transition; and
      wherein a gate and a drain terminal of said n-channel transistor are connected to a voltage source and a source terminal is connected to an output terminal of one of said devices, and wherein a gate and a drain terminal of said p-channel device are connected to ground and a source terminal is connected to an output terminal of one of said devices such that such n-channel transistor and said p-channel transistor operate as diodes.

12. The memory device of claim 11, wherein said source terminals are connected to the output terminal of the same device.

* * * * *

UNITED STATES PATENT AND TRADEMARK OFFICE
CERTIFICATE OF CORRECTION

PATENT NO. : 6,434,061 B1
DATED : August 13, 2002
INVENTOR(S) : Huber

It is certified that error appears in the above-identified patent and that said Letters Patent is hereby corrected as shown below:

Column 1,
Line 48, insert a space after the digits "180" and before the word "degrees";

Column 6,
Line 10, delete the digits "240" and replace with -- 124 --;

Signed and Sealed this

Twenty-first Day of January, 2003

JAMES E. ROGAN
*Director of the United States Patent and Trademark Office*

UNITED STATES PATENT AND TRADEMARK OFFICE
CERTIFICATE OF CORRECTION

| | | |
|---|---|---|
| PATENT NO. | : 6,434,061 B1 | Page 1 of 1 |
| DATED | : August 13, 2002 | |
| INVENTOR(S) | : Huber | |

It is certified that error appears in the above-identified patent and that said Letters Patent is hereby corrected as shown below:

<u>Column 4,</u>
Line 40, delete the word "path" and replace with -- paths --

<u>Column 8,</u>
Line 66, Add the the following new claims:

13. The compensation circuit of claim 1 wherein said transition includes a transition from a high to a low state.

14. The compensation circuit of claim 1 wherein said transition includes a transition from a low to a high state.

Signed and Sealed this

Twenty-second Day of July, 2003

JAMES E. ROGAN
*Director of the United States Patent and Trademark Office*